United States Patent [19]

Sasaki et al.

[11] Patent Number: 5,703,974

[45] Date of Patent: Dec. 30, 1997

[54] SEMICONDUCTOR PHOTONIC INTEGRATED CIRCUIT AND FABRICATION PROCESS THEREFOR

[75] Inventors: Tatsuya Sasaki; Takeshi Takeuchi, both of Tokyo, Japan

[73] Assignee: NEC Corporation, Japan

[21] Appl. No.: 680,290

[22] Filed: Jul. 12, 1996

[30] Foreign Application Priority Data

Jul. 13, 1995 [JP] Japan .................. 7-199287

[51] Int. Cl.[6] .............. G02B 6/12; H01S 3/19
[52] U.S. Cl. .................. 385/14; 385/8; 385/9; 372/45; 372/50
[58] Field of Search .................. 385/14, 8, 9, 28, 385/40, 41, 43, 50; 372/45–48, 50

[56] References Cited

U.S. PATENT DOCUMENTS

| 4,794,346 | 12/1988 | Miller ................. | 372/45 |
| 4,809,287 | 2/1989 | Ohba et al. ........... | 372/45 |
| 5,042,049 | 8/1991 | Ohtoshi et al. ........ | 372/45 |
| 5,278,926 | 1/1994 | Doussiere ............. | 385/28 |
| 5,459,747 | 10/1995 | Takiguchi et al. ..... | 372/50 |
| 5,521,994 | 5/1996 | Takeuchi et al. ...... | 385/14 |

FOREIGN PATENT DOCUMENTS

| 4105383 | 4/1992 | Japan ................. | H01S 3/18 |
| 4303982 | 10/1992 | Japan ................. | H01S 3/18 |
| 6260727 | 9/1994 | Japan ................. | H01S 3/18 |
| 7-12092 | 1/1995 | Japan . | |
| 6144283 | 1/1996 | Japan ................. | H01S 3/18 |
| 6146894 | 1/1996 | Japan ................. | H01L 27/15 |

OTHER PUBLICATIONS

K.Y. Liou et al, Operation of Integrated InGasAsP–InP Optical Amplifier—Monitoring Detector with Feedback Control Circuit, IEEE Photonics Technology Letters, vol. 2, No. 12, Dec. 1990.

Thomas L. Koch, Semiconductor Photonic Integrated Circuits, IEEE Journal of Quantum Electronics, vol. 27, No. 3, Mar. 1991.

Aoki et al, InGaAs/InGaAsP MQW Electroabsorption Modulator Integrated with a DFB Laser Fabricated by Band–Gap Energy . . . , IEEE Journal of Quantum Electronics, vol. 29, No. 6, Jun. 1993.

Primary Examiner—Brian Healy
Assistant Examiner—Hemang Sanghavi
Attorney, Agent, or Firm—Hayes, Soloway, Hennessey, Grossman & Hage, P.C.

[57] ABSTRACT

On a surface of an n-InP substrate, a mask of $SiO_2$ layer wide in an active region and narrow in a passive region and having a constant gap width. In a waveguide region defined between the masks, a waveguide structure constituted of an n-InGaAsP guide layer, an undoped InGaAsP optical waveguide layer and a p-InP clad layer is selectively grown to form. Again, utilizing $SiO_2$ layer, a mask is formed on the surface of the p-InP layer in the active region and a pair of masks defining the waveguide structure is formed in a the passive region, and high resistance InP layer is grown. Also, in the active region, a p-InP layer, a p-InGaAs contact layer are selectively grown. By forming $SiO_2$, a window is formed to form p-side electrode. An n-type electrode is formed on the back surface of the substrate, By this, a device having an optical loss in the active region and passive region becomes low, a coupling coefficient between both regions is high. Also, an element capacitance can become small to enable high speed operation.

6 Claims, 11 Drawing Sheets and 5,703,974

SEMICONDUCTOR PHOTONIC INTEGRATED CIRCUIT AND FABRICATION PROCESS THEREFOR

BACKGROUND OF THE INVENTION

1. Field of the Invention

The present invention relates to a semiconductor photonic integrated circuit to be employed in an optical communication, optical information processing and so forth.

2. Description of the Related Art

A semiconductor photonic integrated circuit, in which a semiconductor laser, a semiconductor optical amplifier and so forth are connected by an optical waveguide, has been given importance as key device to be employed in an optical communication, an optical information processing and so forth toward the future. By integrating various optical functional elements in monolithic fashion on a semiconductor substrate, it becomes possible to realize a compact module which does not require to connect various functional elements by means of optical fibers and has low optical loss. Therefore, research and development for photonic integrated circuit has been actively performed, For integrating an active region, such as laser or so forth, and a passive region, such as an optical waveguide and so forth in monolithic manner, it becomes necessary to optically connect optical waveguide layers having mutually different bandgap energies. Also, in order to suppress insertion loss of integrated elements to be low, it is desirable to lower waveguide loss of the optical waveguide and coupling loss of a connecting portion as low as possible.

FIGS. 1A, 1B and 1C show one example of a structure of the conventional photonic integrated circuit (as disclosed in K. Y. Liou et al., IEEE Photonics Technology Letters, Vol. 2, pp 878–880). FIGS. 1A and 1B are sections of an active region and a passive region, respectively. On the other hand, FIG. 1C shows a connecting portion of both of the active and passive regions, as shown in a section viewed in a direction parallel to the paper surface of FIGS. 1A and 1B. In the active region shown in FIG. 1A, a waveguide structure of InGaAsP guide layer 2 and InGaAsP active layer 3c which is stacked on the surface of an n-InP substrate 1 and etched in mesa shaped configuration is buried in a Fe doped high resistance InP layer 11a.

Also, on the surface of the waveguide structure, p-InP layer 5 and p-InGaAs contact layer 6 are stacked. On the surface of the p-InGaAs contact layer 6, a p-side electrode 22 is formed. On the other hand, on the back surface of the substrate 1, n-side electrode 23 is formed. In the structure, in which the waveguide structure is buried in the high resistance InP layer 11a, a leak current under current injection can be suppressed and capacitance of the element is lowered to obtain high speed response characteristics.

On the other hand, in the passive region of FIG. 1B, after removing the InGaAsP active layer 3c, mesa etching is performed for the remaining InGaAsP guide layer 2, and then entire surface is buried in the high resistance InP layer 11a. By burying in the high resistance InP layer 11a, a waveguide having relative low waveguide loss can be obtained.

As shown in FIG. 1C, in a waveguide connecting structure in the structure set forth above, the InGaAsP guide layer 2 is formed over an active region 29 and a passive region 30, and the InGaAsP active layer 3c is formed on the InGaAsP guide layer 2 only in the active region 29. Therefore, the light in the active region 29 cannot propagate sufficiently to the guide layer 2 in the passive region 30 to make it insufficient to achieve high coupling efficiency of waveguide light between the active and passive regions. Also, since the process includes a step for performing selective etching for the active layer 3c of the passive region, and requires mesa etching for forming the waveguide structure, fabrication process becomes complicated to achieve poor reproductivity and uniformity.

As a solution for such problem, methods employing selective growth method have been proposed (Japanese Unexamined Patent Publications (Kokai) Nos. Heisei 4-105383, Heisei 4-303982 and Heisei 6-260727, for example). FIGS. 2A, 2B and 2C are sections respectively showing structures of the photonic integrated circuit fabricated by the selective growth method. FIG. 2A is the section showing the active region. FIGS. 2B and 2C are sections showing the passive regions.

On the other hand, FIGS. 3A, 3B and 3C show mask patterns to be employed for fabrication of the conventional semiconductor photonic integrated circuit shown in FIGS. 2A to 2C. As shown in FIG. 3A, on the surface of the n-InP substrate 1, a mask 12 constituted of a pair of stripe form dielectric layers, such as $SiO_2$ is formed. A region between the stripe form mask becomes a waveguide region 31. Here, the passive region 30 becomes narrower than the active region, in which a mask width is Wm. When the InGaAsP guide layer 2, the InGaAsP active layer 3c and a p-InP clad layer 4 are grown on the substrate 1 formed with the pattern set forth above by metal-organic vapor phase epitaxy (MOVPE) method, the waveguide structure is selectively formed in the waveguide region 31 between the masks 12, as shown in FIGS. 2A and 2B.

Next, removing the masks 12, masks 12 having the same mask width are formed at both sides of the new waveguide region 31, as shown in FIG. 3C. Then, the p-InP layer 5 and a p-InGaAs contact layer 6 are grown to cover the waveguide structure, as shown in FIGS. 2A and 2B. Covering the semiconductor layer on the active region 29 with $SiO_2$ layer 21, and after subsequently forming window, the p-side electrode 22 is formed on the surface of the contact layer 6 on the active region. Furthermore, the n-side electrode 23 is formed on the back surface of the substrate 1 to form a current injection mechanism for injecting current into the active layer 3c of the active region.

A section of the photonic integrated circuit thus formed in the waveguide direction is shown in FIG. 4. In selective MOVPE method, the layer thickness of the selectively grown InGaAsP layer becomes greater and the bandgap energy becomes narrower at wider mask width Wm. Accordingly, the bandgap energy of the selectively grown InGaAsP layer 3c becomes larger at the passive region 30 in comparison with that in the active region 29. If variation amount is sufficiently large, the active layer 3c in the passive region can be made sufficiently transparent with respect to a radiated light from the active region. Thus, a waveguide coupling structure can be formed by one-step crystal growth. With this structure, since there is not discontinuous of the waveguide in the coupling portion, approximately 100% of coupling efficiency can be obtained.

On the other hand, as shown in FIG. 3B, it is possible to grow the waveguide structure without forming the mask 12 in the passive region 30. Then, as shown in FIG. 3C, selectively form the p-InP layer 5 and the P-InGaAs contact layer 6. In this case, in the passive region 30, semiconductor layers 5 and 6 in ridge structure are formed to confine a light, as shown in FIG. 2C.

In this method, the photonic integrated circuit can be formed by twice of crystal growth, in total. However, in the passive region, since p-InP layer 5 is formed as shown in FIG. 2B or 2C, due to absorption by impurity level in the p-InP layer 5 in which light spreading loss of the waveguide becomes large to make it impossible to obtain a waveguide with low loss. Therefore, as shown in the sections of FIGS. 5A and 5B, it is considered to cover the waveguide region with the p-InP layer 5 in the active region and with an undoped InP layer 11b in the passive region (Japanese Unexamined Patent Publication No. Heisei 6-144283). Thus, low loss waveguide having sufficiently low absorption loss in the InP layer in the passive region 30 can be obtained. However, in this case, undoped InP layer 11b and the p-InP layer 6 are separately grown in the passive region 30 and the active region 29.

Another method has been disclosed in Japanese Unexamined Patent Publication No. Heisei 6-146894 as an integrated structure of the photodiode and the light waveguide. The sections of the disclosed integrated structure are shown in FIGS. 6A and 6B. After growing the waveguide structure, on both of the active region of FIG. 6A and the passive region of FIG. 6B, undoped InP layer 11b is grown. Thereafter, only in the active region, Zn is diffused up to the upper portion of the InGaAsP active layer 3c to form Zn diffusion layer, in which conductivity type is inverted into p-type, to form a current injection path. By this method, the integrated circuit of the photodiode and low loss optical waveguide can be formed by twice performing crystal growth.

However, in the element structure shown in FIGS. 1A to 1C, since the waveguide is formed by mesa etching after etching with maintaining the active layer 3c only in the active region, fabrication is not easy. Furthermore, coupling efficiency cannot be sufficient.

On the other hand, in the structure of FIGS. 2A to 2C, while the waveguide structure having high coupling efficiency can be achieved without performing etching of the semiconductor, it has high waveguide loss since the waveguide structure is covered with the p-InP layer 6 even in the passive region.

In the structure of FIGS. 5A and 5B, while low loss passive element can be obtained, since on junction of InP is formed in relatively wide region at both sides of the waveguide structure, leak current flowing in forward direction through the pn junction is increased according to increasing of the injected current to make it difficulty to obtain high gain. When the shown structure is employed as photodiode, amount of a dark current becomes a level which can not be ignored. Also, by presence of pn junction, a problem of relative hugh element capacitance to make it difficult to perform high speed modulating operation, can be encountered.

Even in the structure of FIGS. 6A and 6B, low loss waveguide can be obtained. Also, the area of the pn junction in the active region shown in FIG. 6A is smaller than that in the case of FIG. 6B. However, because of low precision in the diffusion depth of Zn, reproductivity in fabrication is poor.

SUMMARY OF THE INVENTION

Therefore, it is an object of the present invention to provide a semiconductor photonic integrated circuit which has high coupling efficiency between an active region and a passive region, low light loss in the passive region, low element capacitance and can be fabricated at high precision and high reproductivity, and fabrication process therefor.

With the semiconductor photonic integrated circuit, with simple fabrication process, high performance active element, such as high output semiconductor laser, a high gain optical amplifier, a low noise photodiode having superior high speed characteristics and a low loss optical waveguide can be integrated in monolithic manner under high coupling efficiency.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

Next, the preferred embodiment of the present invention will be discussed with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

[FIRST EMBODIMENT]

Figure 1A:
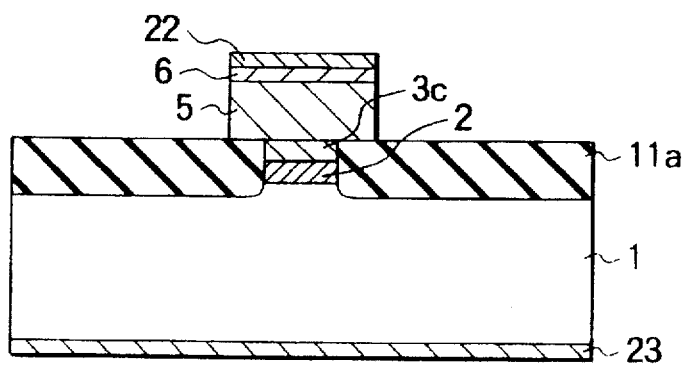
FIGS. 1A to 1C are section of the conventional semiconductor photonic integrated circuit.
Figure 1B:
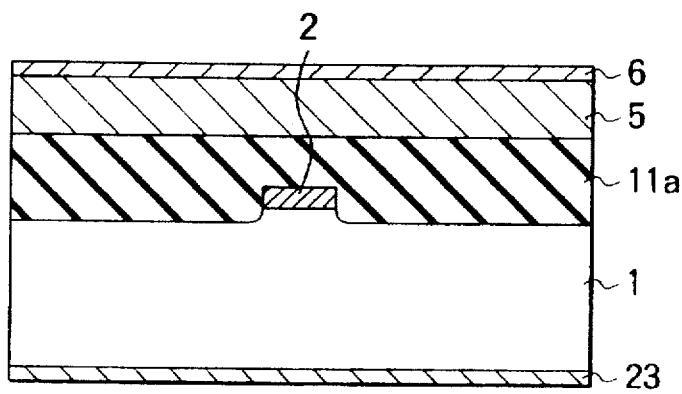
Figure 1C:
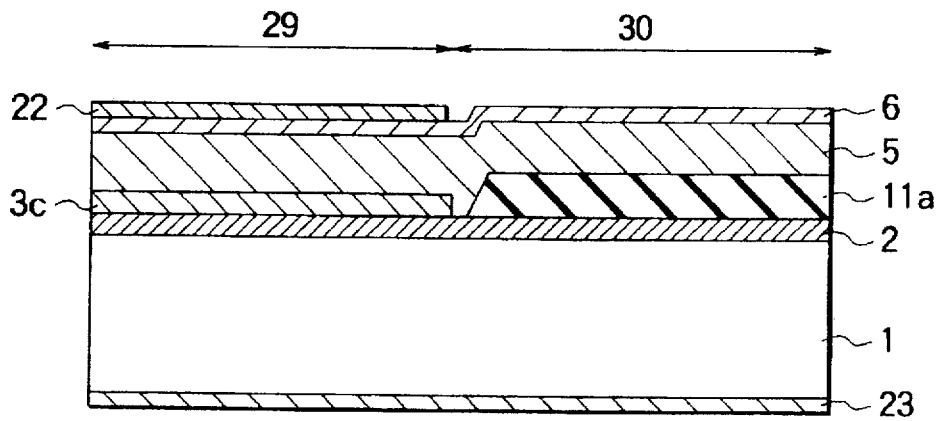
Figure 2A:
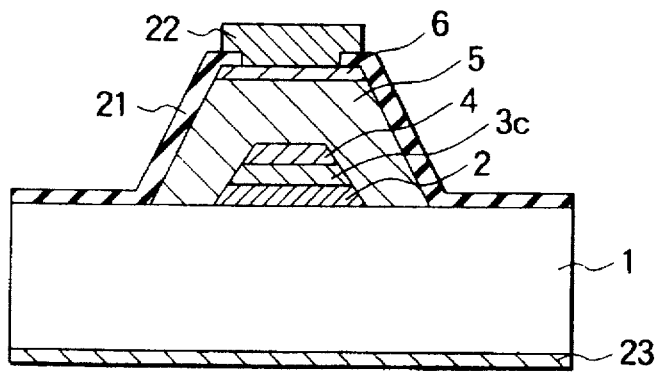
FIGS. 2A to 2C are sections at a plane perpendicular to a waveguide of another semiconductor photonic integrated circuit.
Figure 2B:
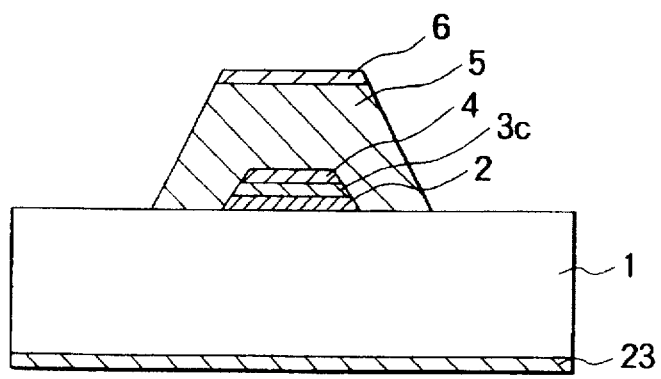
Figure 2C:
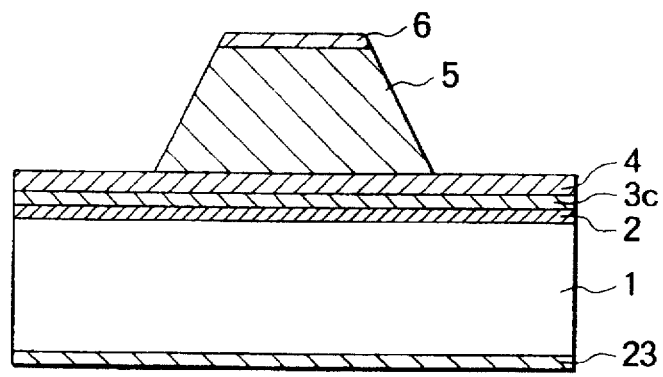
Figure 3A:
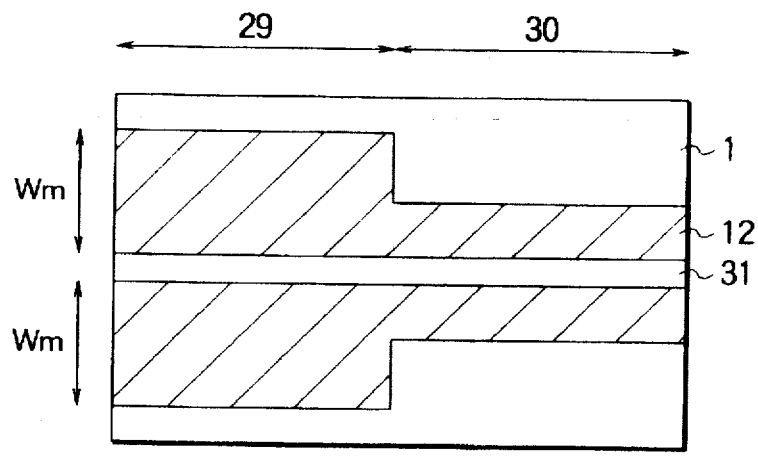
FIGS. 3A to 3C are mask patterns for explaining a fabrication process of the conventional semiconductor photonic integrated circuit shown in FIGS. 2A to 2C.
Figure 3B:
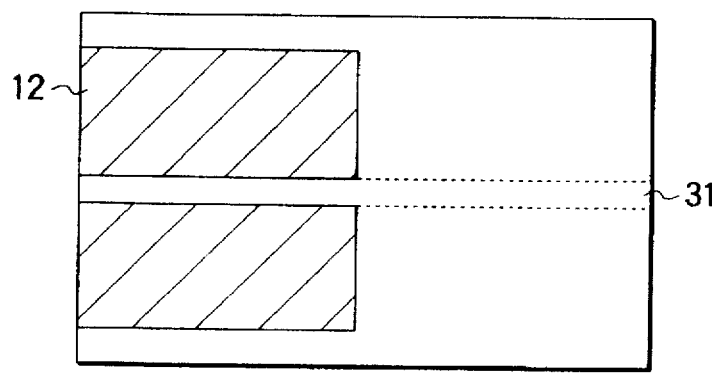
Figure 3C:
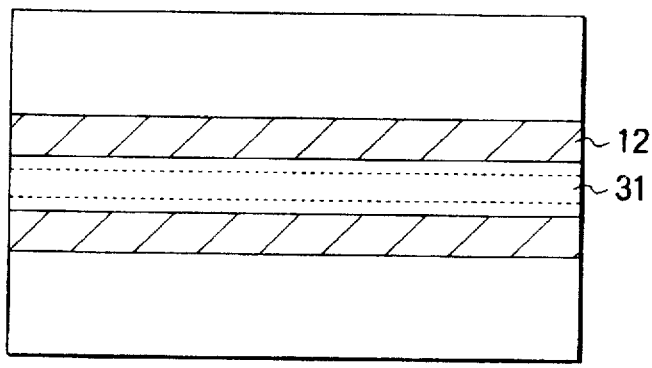
Figure 4:
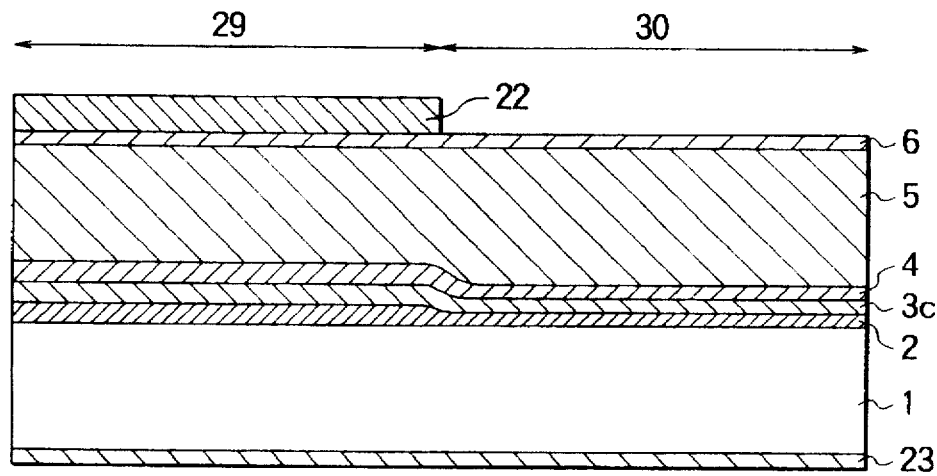
FIG. 4 is a section at a plane parallel to a waveguide of the conventional semiconductor integrated circuit of FIGS. 2A to 2C.
Figure 5A:
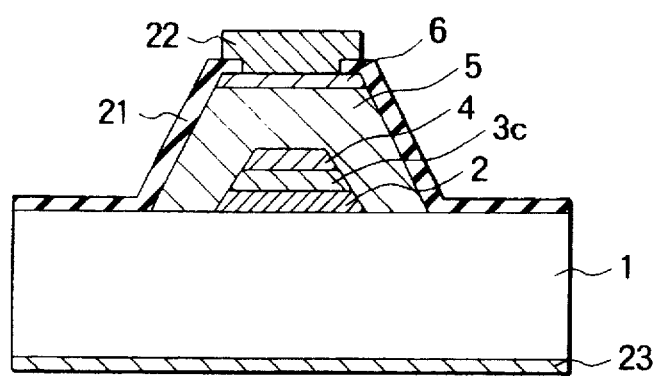
FIGS. 5A and 5B are sections of the conventional semiconductor photonic integrated circuit which solves a problem in the semiconductor photonic integrated circuit of FIGS. 2A to 2C.
Figure 5B:
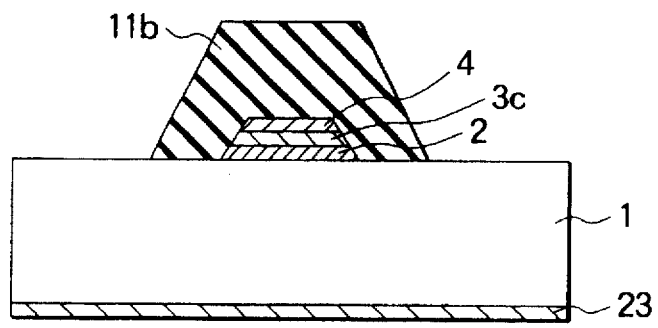
Figure 6A:
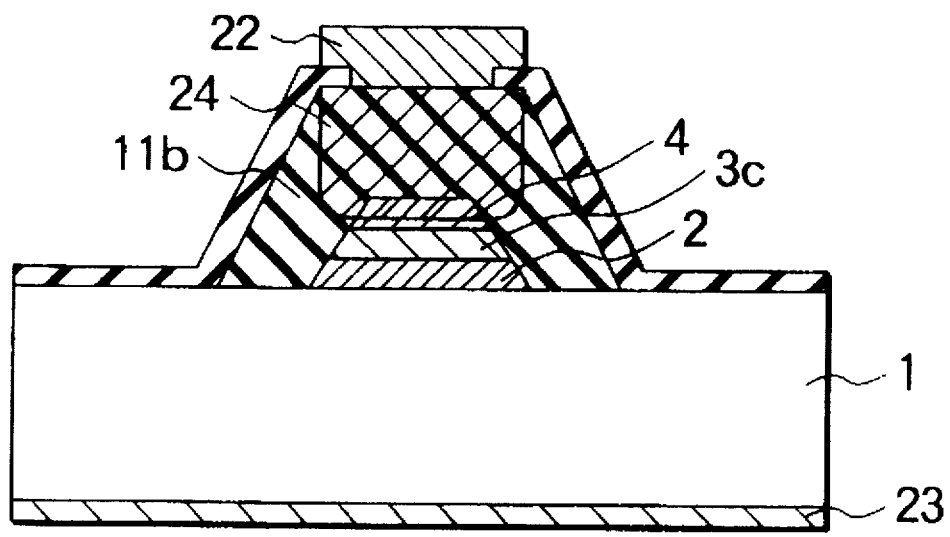
FIGS. 6A and 6B are sections of the conventional semiconductor photonic integrated circuit which solves a problem in the semiconductor photonic integrated circuit of FIGS. 2A to 2C and 5A, 5B.
Figure 6B:
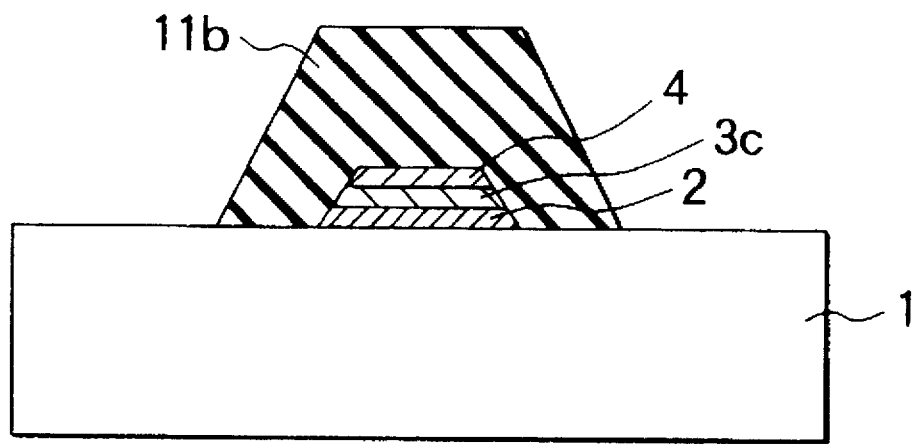
Figure 7A:
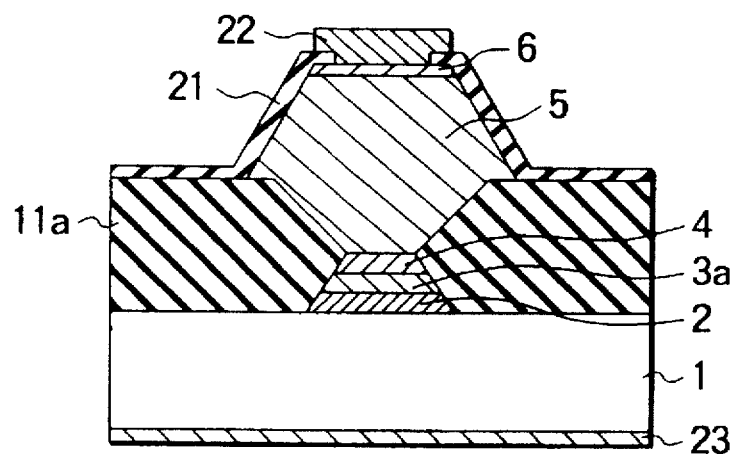
FIGS. 7A to 7C are section at a plane perpendicular to the first embodiment of a waveguide according to the present invention.
Figure 7B:
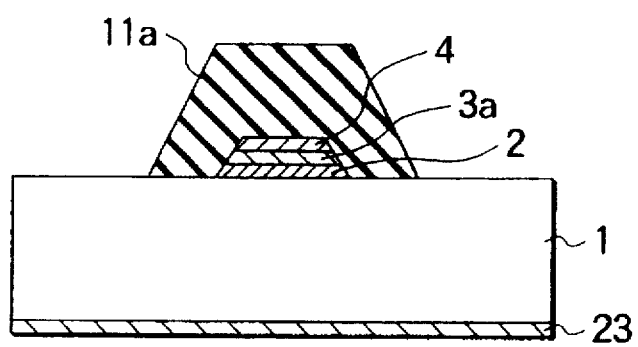
Figure 8:
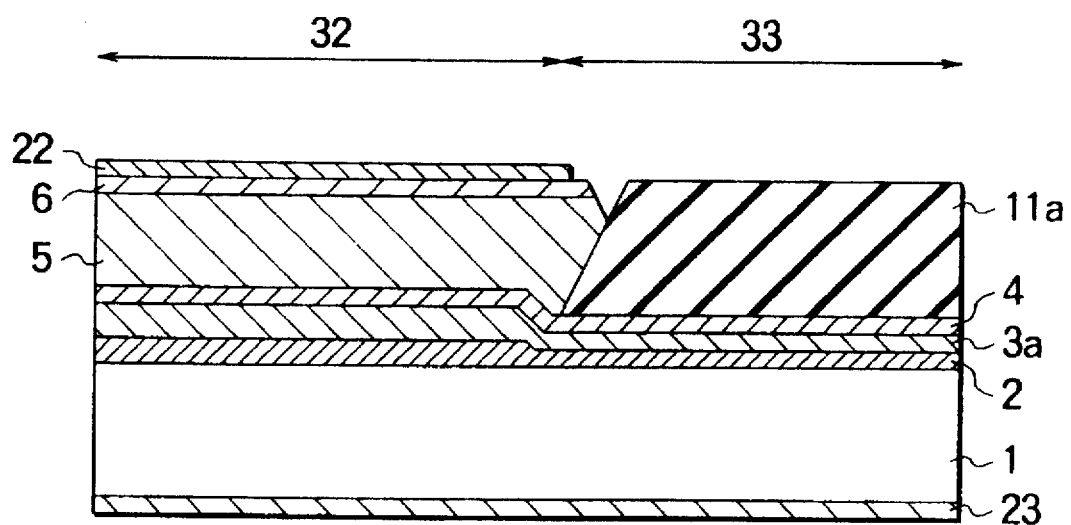
FIG. 8 is a section at a plane perpendicular to the first embodiment of a waveguide according to the present invention.

As the first embodiment, discussion will be given for an example where a distributed feedback (DFB) semiconductor laser and a spot size converted light waveguide are integrated. FIG. 7A is a section of the DFB laser, FIG. 7B is a section at a light waveguide, and FIG. 8 is a section along the light waveguide of the photonic integrated circuit. On the other hand, FIGS. 9A to 9C are illustration of mask patterns in respective steps.

Figure 9A:
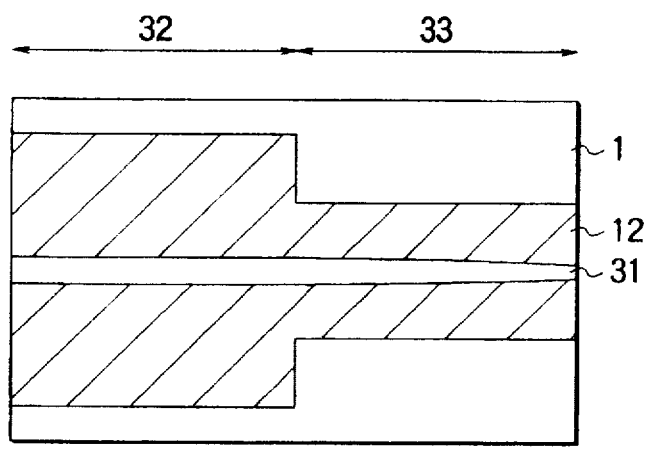
FIGS. 9A to 9C show mask patterns for explaining the fabrication process of the first embodiment of the invention.
Figure 9B:
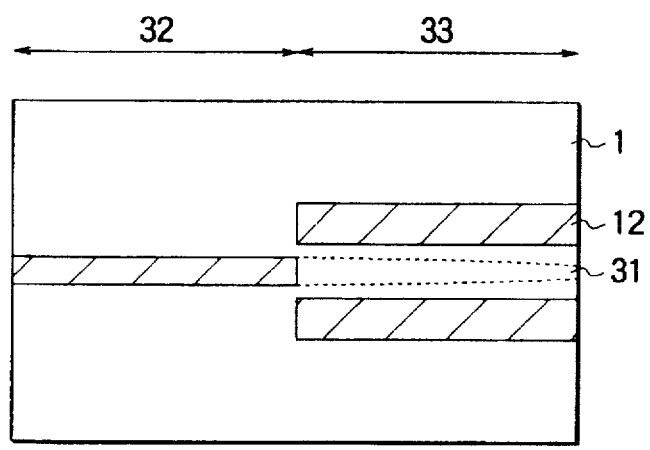
Figure 9C:
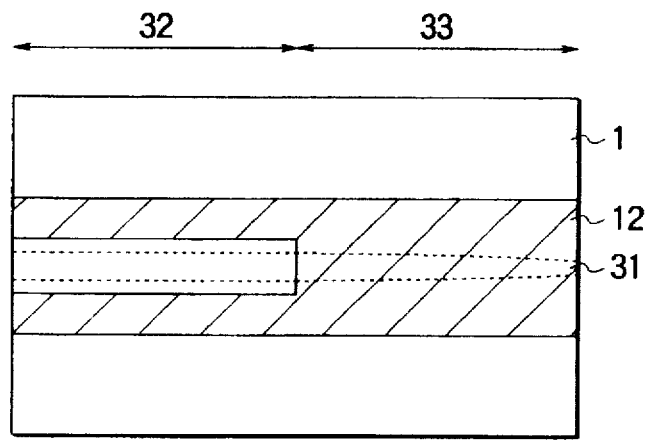

At first, as shown in FIG. 9A, masks 12 of $SiO_2$ are formed on a surface of an n-InP substrate 1 formed with a diffraction grating on a surface of a DFB laser region 32. It should be noted that the diffraction grating is not illustrated in FIG. 9A. A mask width Wm is 30 μm in a DFB laser region 32 and 5 μm in an optical waveguide region.

On the other hand, the width of a waveguide region 31 defined between the masks 12 is 1.5 μm in the DFB laser region 32 and is varied from 1.5 μm to 0.7 μm in taper form.

Next, by metal organic vapor phase epitaxy (MOVPE) method, a waveguide structure constituted of an n-InGaAsP guide layer 2 (1.15 μm composition, layer thickness 0.1 μm, doping concentration $1 \times 10^{-18}$ $cm^{-3}$), an undoped InGaAsP optical waveguide layer (active layer) 3a (1.3 μm composition, layer thickness 0.15 μm) and a p-InP clad layer 4 (layer thickness 0.3 μm, doping concentration $7 \times 10^{17}$ $cm^{-3}$), is selectively grown. Compositions and layer thicknesses are the values in a DFB laser region. A photoluminescence light emitting peak wavelength is 1.3 μm in the DFB laser region 32, and 1.2 μm in the optical waveguide region 33, for example.

Next, $SiO_2$ layer is again formed on a surface, as shown in FIG. 9B. The $SiO_2$ layer is patterned to form masks 12 on the surface of a p-InP clad layer 4 of the waveguide region 31 in the DFB laser region 32. On the other hand, in the light waveguide region 33, a pair of masks 12 of $SiO_2$ layers, 10 μm in width and 6 μm in gap, for example, are formed to define the waveguide region 31. Subsequently, Fe doped high resistance InP layer 11a (layer thickness 1.5 μm, doping concentration $5 \times 10^{16}$ $cm^{-3}$) is grown.

Furthermore, as shown in FIG. 9C, the masks 12 of a pair of stripe form $SiO_2$ layers of 10 μm in width and 6 μm in gap, defining the waveguide region 31 in the DFB laser region 32, and a $SiO_2$ layer in 26 μm in width covering the waveguide region 31 in the optical waveguide region 33, are formed. Also, a p-InP layer 5 (layer thickness 1.5 μm, doping concentration $7 \times 10^{17}$ $cm^{-3}$, for example) and a p-InGaAs contact layer 6 (layer thickness 0.3 μm, doping concentration $1 \times 10^{19}$ $cm^{-3}$) are grown.

After completion of epitaxial growth, $SiO_2$ layer 21 is formed on the surface of the DFB laser region 32. Then, window is formed on the surface of the p-InGaAs contact layer 6 to form stripe form p-side electrode 22 is formed. After grinding the back surface of the n-InP substrate 1, an n-side electrode 23 is formed on the back surface of the substrate. Then, cleavage is effected so that element lengths of DFB laser and the optical waveguide become 300 μm, for example. Then, an anti-reflection coating is provided at both end faces.

With such construction, as shown in FIG. 7A, the active region becomes a buried structure covered with both sides of high resistance layer 11a, for enabling high power operation of the laser. On the other hand, the laser is characterized by superior high speed response for low element capacitance. On the other hand, even in the passive region, since the waveguide structure is covered with high resistance InP layer having low impurity concentration, waveguide loss can be suppressed to be low.

Furthermore, since the active region and the passive region are formed in one time of crystal growth, superior optical coupling efficiency can be achieved. Furthermore, since epitaxial layer can be formed without performing etching, yield of the device, uniformity, reproductivity become superior.

Next, characteristics of the element fabricated under the condition exemplified as above will be discussed herebelow. An oscillation threshold current of the DFB laser was 20 mA, and a slope efficiency from the waveguide side was 0.2 W/A, an optical output higher than or equal to 30 mW was obtained. Since the size of the output side of the waveguide is made smaller, a narrow far-field pattern of an output light had less than or equal to 10° in full width at half maximum. In such waveguide, leakage of the waveguide light into the InP layer becomes large. However, waveguide loss becomes low as buried with the high resistance InP layer 11a, waveguide loss is low and high optical output can be attained.

Figure 7C:
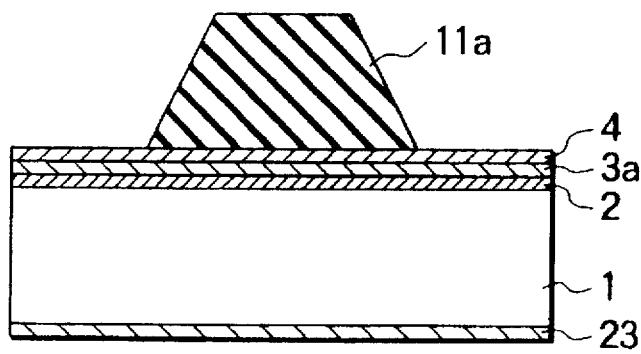

On the other hand, similarly to the prior art, in the mask pattern of FIG. 9A, the mask 12 can be formed only in the DFB laser region 32. Thus, in the leading waveguide region 33, the waveguide structure is formed in the entire surface. Subsequently, it is possible to form the optical waveguide in ridge structure, in which the high resistance InP layer 11a is selectively formed in the optical waveguide region 33 with the mask patterns of FIGS. 9B and 9C. In this case, the section of the optical waveguide region 33 becomes as illustrated in FIG. 7C.

[SECOND EMBODIMENT]

Figure 10A:
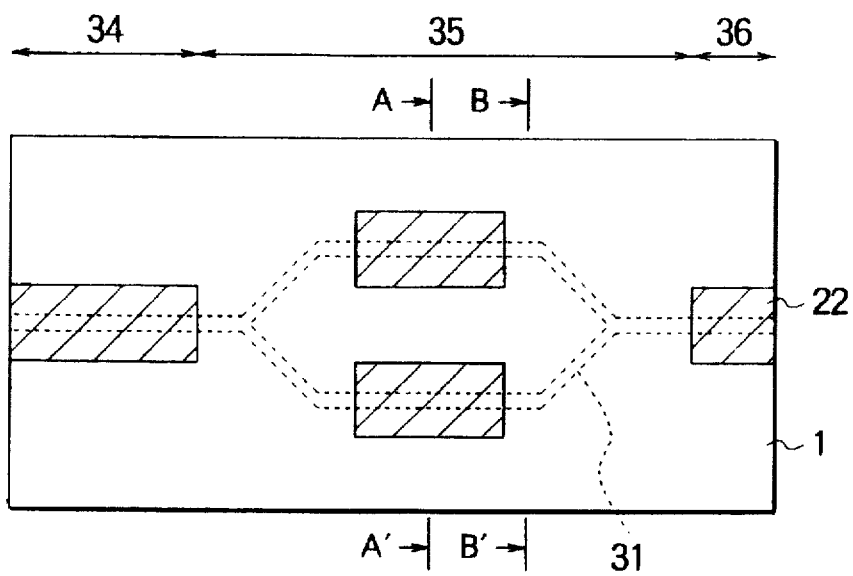
FIG. 10A is a plan view of the second embodiment of the present invention.
Figure 10B:
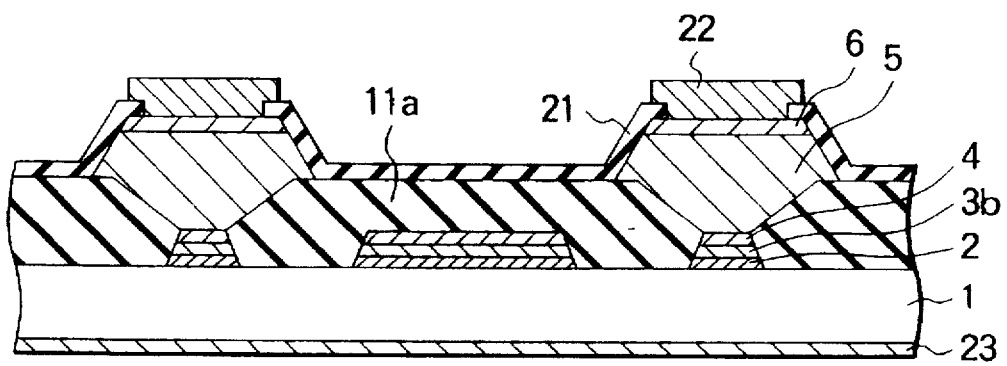
FIGS. 10B, 10C are sections taken along lines A-A' and B-B' of FIG. 10A.
Figure 10C:
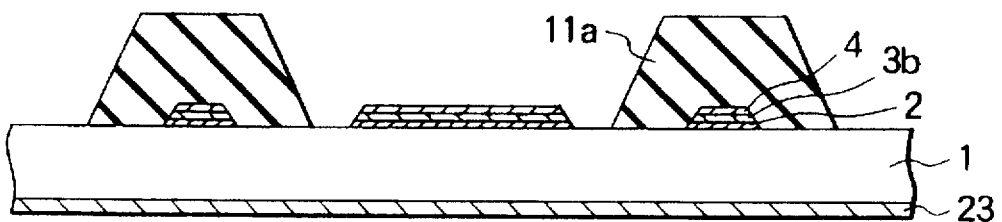

Next, as the second embodiment, discussion will be given as an example where the DFB laser, a Mach-Zehnder interference-type optical modulator and an optical amplifier are integrated. FIG. 10A is a plan view showing the general construction, FIGS. 10B and 10C are sections taken along lines A-A' and B-B' of FIG. 10A.

At first, on the surface of the n-InP substrate 1, in which the diffraction grating is formed on the surface of the DFB laser, the $SiO_2$ mask is formed. The mask width Wm is 30 μm in the DFB laser region 34 and the optical amplifier region 36, 20 μm in the portion of the electrode 22 of the Mach-Zehnder optical modulator region 35, and 5 μm in the coupler portion. On the other hand, the width of the waveguide region 31 disposed between the masks is constant at 1.5 μm, for example. Branching angle at the coupler is 1° and curve radius is 5 mm, for example.

Next, by MOVPE method, a waveguide structure constituted of the n-InGaAsP guide layer 2 (1.3 μm composition, 0.1 μm in layer thickness, $1 \times 10^{18}$ $cm^{-3}$ in doping concentration), a multi-layer quantum well active layer 3b (15 in well number) including strain InGaAsP quantum well layer (1% of compressive strain, 7 nm of layer thickness), unstrained InGaAsP barrier (1.5 μm composition, 12 nm of layer thickness), the p-InP clad layer 4 (0.3 μm in layer thickness, $7 \times 10^{17}$ $cm^{-3}$ in doping concentration) is selectively grown. Composition, layer thickness and strain magnitude are the values in the DFB laser region. For example, photo-luminescence light emitting peak wavelength is 1.55 μm in the DFB laser region 34, 1.46 μm at the portion of the electrode 22 in the Mach-Zehnder optical modulator region 35, and 1.3 μm in the portion of the coupler.

Next, $SiO_2$ is formed on the surface again, and in the active region, in which the electrode 22 is formed, the $SiO_2$ mask is formed on the surface of the p-InP clad layer 4 of the waveguide region 31. On the other hand, in the coupler portion, a pair of masks having 10 μm in width and 6 μm in gap, are formed at both sides of the waveguide region 31. Subsequently, Fe doped high resistance InP layer 11a (1.5 μm in layer, $5\times10^{16}$ cm$^{-3}$ in doping concentration) is grown. Furthermore, in the active region, a pair of stripe shaped SiO$_2$ mask of 10 μm in width and 6 μm in gap, and in the coupler, SiO$_2$ mask of 26 μm in width covering the waveguide region 31 are formed. The p-InP layer 5 (1.5 μm in layer thickness, $7\times10^{17}$ cm$^{-3}$), the p-InGaAs contact layer (0.3 μm in layer thickness, $1\times10^{19}$ cm$^{-3}$) are grown in order.

After completion of epitaxial growth, the SiO$_2$ layer 21 is formed on the surface of the electrode forming region. Then, a window is formed in the surface of the p-InGaAs contact layer 6 to form the stripe shaped p-side electrode 22. After grinding the back surface of the n-InP substrate 1, an n-side electrode 23 is formed on the back surface of the substrate. Then, cleavage is effected so that element lengths of DFB laser and the optical amplifier become 300 μm, for example. Then, an anti-reflection coating is provided at both end faces. Also, the end face of the optical amplifier side is formed into a window structure, in which the waveguide structure is interrupted and buried by the high resistance InP layer 11a.

With such construction, as shown in FIG. 10A, the active region becomes a buried structure covered both sides with high resistance layer 11a. The waveguide loss can be thus suppressed. Furthermore, since the optical waveguide in the active region and the passive region is formed at one time of growth, it can achieve superior optical coupling efficiency. Also, the semiconductor layer is formed with the elements without performing etching, high yield of device, uniformity and reproductivity can be achieved.

It should be noted that, in the shown embodiment, the multi-layer quantum well structure employing InGaAsP as quantum well, is employed in place of the InGaAsP bulk semiconductor layer. However, in this case, since both of the quantum well thickness and strain amount cause variation of the bandgap energy, larger bandgap energy shift is caused than that in the case of bulk semiconductor.

The oscillation threshold current of the fabricated element was 20 mA. When 50 mA of current was injected to the optical amplifier, an optical output was 5 mW. At this time, insertion loss in the Mach-Zehnder optical modulator was estimated to be 12 dB. A extinction ratio upon application of 3 V to one side electrode of the optical modulator, was 20 dB. On the other hand, a capacity was 0.6 pF, and modulation band was about 8 GHz. It should be noted that separation resistance between electrodes in the modulator was sufficiently high to be higher than or equal to 10 kΩ, with employing the high resistance InP layer 11a.

Thus, the photonic integrated circuit, in which the laser, optical modulator and the optical amplifier are integrated could be fabricated with lowering insertion loss in simple fabrication process and with superior high speed response characteristics.

[THIRD EMBODIMENT]

Figure 11:
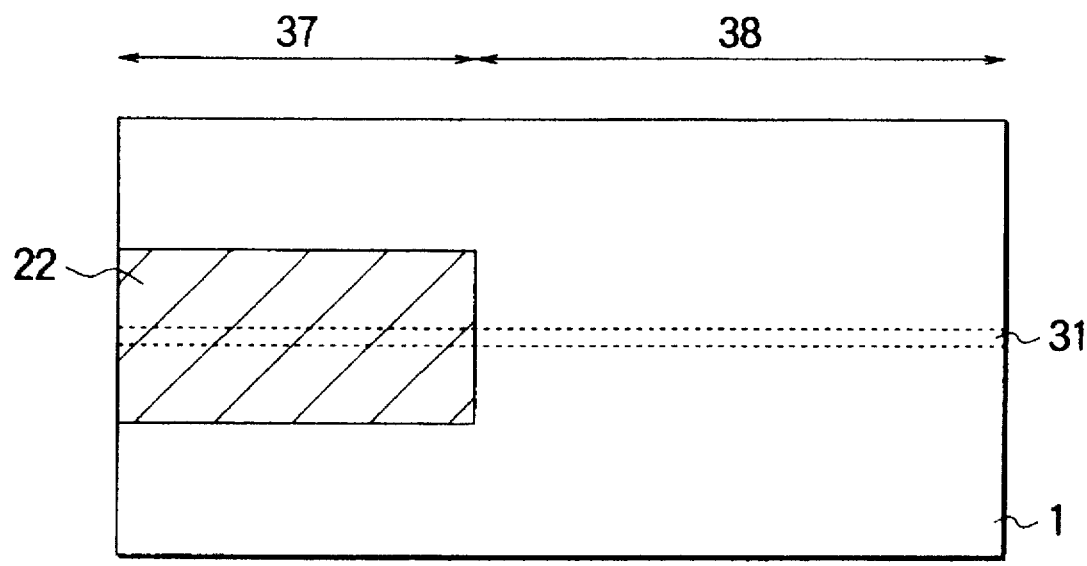
FIG. 11 is a plan view of the third embodiment of the present invention.

Next, as the third embodiment, discussion will be given for an example, in which the photodiode and the optical waveguide are integrated. FIG. 11 is a plan view of general construction of the embodiment. The sectional structure is similar to FIGS. 7A to 7C. FIG. 7A shows a section of the photodiode, FIG. 7B shows a section of the optical waveguide. It should be noted that, in the shown embodiment, the optical waveguide layer 3a in the first embodiment is replaced with a multi-layer quantum well light absorption layer and an InGaAsP optical confining layer. Also, undoped InP is employed in the high resistance InP layer 11a. On the other hand, the mask pattern to be employed in fabrication are substantially the same as those illustrated in FIGS. 9A to 9C.

At first, a SiO$_2$ mask is formed on the surface of the n-InP substrate 1 is formed. The mask width Wm is 30 μm in a photodiode region 37, and 6 μm in an optical waveguide region 38, for example. On the other hand, the width of the waveguide region 31 defined by the mask is constant at 1.5 μm, for example. Next, by the MOVPE method, a waveguide structure is selectively grown, which waveguide structure comprises a multi-layer quantum well light absorbing layer (well number being 7) constituted of an n-InGaAsP guide layer 2 (1.1 composition, 0.1 μm in layer thickness, $1\times10^{18}$ cm$^{-3}$ in doping concentration), an InGaAsP quantum well layer (1.35 composition, 7 nm in layer thickness) and an InGaAsP barrier (1.1 μm composition, 12 nm of layer thickness), an InGaAsP confining layer (1.1 μm composition, 0.1 μm in layer thickness, a p-InP clad layer 4 (0.8 μm in layer thickness, $7\times10^{17}$ cm$^{-3}$ in doping concentration). The composition, the layer thickness are the values in the photodiode region 37. The photo-luminance light emitting peak wavelength of the light absorbing layer is 1.31 μm in the photodiode region 37 and 1.15 μm in the optical wave guide region 38.

Next, the SiO$_2$ layer was formed on the surface again. In the photodiode region, in which the electrode 22 is formed, SiO$_2$ mask is formed on the surface of the p-InP clad layer 4 of the waveguide region 31. On the other hand, in the optical waveguide region 38, a pair of SiO$_2$ layers of 10 μm in width and 6 μm in the gap, for example are formed at both sides of the waveguide region 38. Subsequently, an undoped high resistance InP layer (1.5 μm in layer thickness, $2\times10^{15}$ cm$^{-3}$ of carrier concentration) is grown. Furthermore, in the photodiode region 37, a pair of stripe form SiO$_2$ masks of 10 μm in width and 8 μm in gap are formed, and in the optical waveguide region 38, a stripe form SiO$_2$ mask of 26 μm width, for example, covering the waveguide region 31, is formed, again. Then, p-InP layer 5 (1.5 μm in layer thickness, $7\times10^{17}$ cm$^{-3}$) and the p-InGaAs contact layer 6 (0.3 μm in layer thickness, $1\times10^{19}$ cm$^{-3}$ in doping concentration) are grown.

After completion of epitaxial growth, the SiO$_2$ layer 21 is formed on the surface of the electrode forming region. Then, a window is formed in the surface of the p-InGaAs contact layer 6 to form the stripe shaped p-side electrode 22. After grinding the back surface of the n-InP substrate 1, an n-side electrode 23 is formed on the back surface of the substrate. Then, cleavage is effected so that element lengths of the photodiode and the optical waveguide become 300 μm.

With such construction, as shown in FIG. 7A, the active region becomes a buried structure covered both sides with high resistance layer 11a to provide the photodiode with small dark current. Also, since the capacitance of the element is small, superior response can be achieved. On the other hand, even in the optical waveguide region 38, similarly to the case of FIG. 7B, since the waveguide structure is covered with the undoped high resistance, insertion loss can be suppressed to be low.

In practice, the waveguide loss of the optical waveguide of the shown embodiment of the photonic integrated circuit fabricated under the condition set forth above, was lower to be lower than or equal to 1 dB/cm, and the internal quantum efficiency of the photodiode was 100%. On the hand, the dark current at application of 5 V bias was lower than or equal 0.1 nA, and the frequency band was 10 GHz. Thus, photodiode having good characteristics with the optical waveguide of low loss can be integrated with simple process.

[FOURTH EMBODIMENT]

Figure 12:
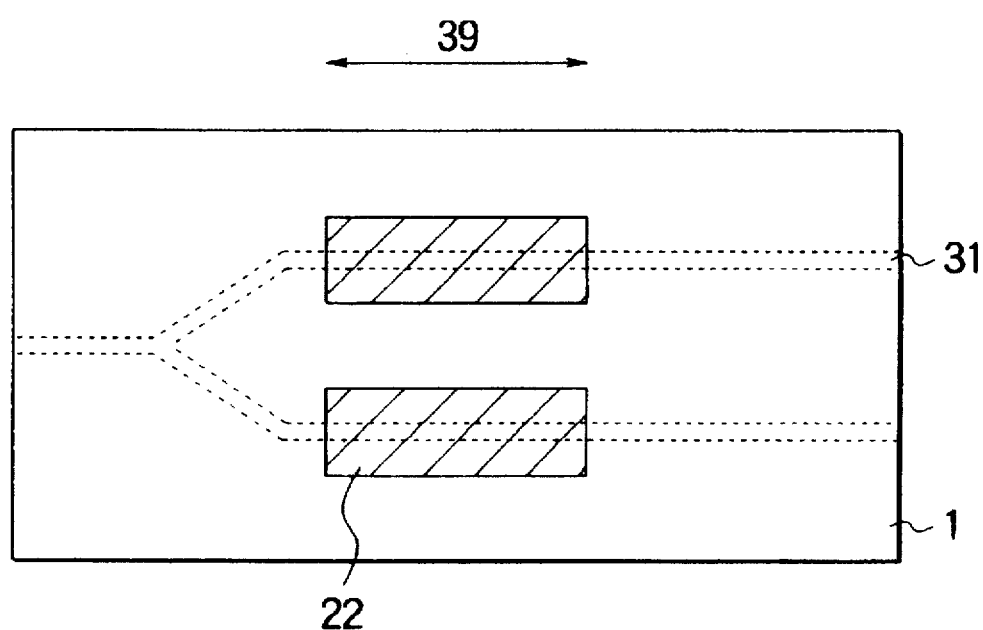
FIG. 12 is a plan view of the fourth embodiment of the present invention.

Next, as the fourth embodiment, discussion will be given for an example, in which a gate optical switch is integrated. FIG. 12 is a general plan view of the shown embodiment. In this embodiment, 1×2 of optical switch is formed. By injecting current via p-side electrode 22 to be a gate electrode, an optical amplifier is operated to pass an incident light. A sectional structure is similar to the first and second embodiments of FIGS. 7A to 7C and 10A to 10C. FIG. 10B corresponds to the section of a gate region 39, and FIG. 7B and FIG. 10C corresponds to section of left and right optical waveguides of the gate region 39. In the shown embodiment, in place of the optical waveguide layer 3a in the first embodiment and the active layer 3b in the second embodiment, a multi-layer quantum well optical waveguide layer and InGaAsP confining layer are employed. Also, as high resistance InP layer 11a, p-type InP with low doping concentration is employed.

At first, on the surface of the n-InP substrate 1, $SiO_2$ mask is formed. The mask width Wm is 30 μm in the gate region 39, and 6 μm in the optical waveguide. The width of the waveguide region 31 defined between the masks is constant at 1.5 μm. The length of the gate region is 300 μm, the gap thereof is 200 μm and branching angle of the coupler is 0.5°, and the curve radius is 5 mm. Next, by way of MOVPE method, the waveguide structure of the multi-layer quantum well optical waveguide layer (well number is 7) constituted of the n-InGaAs guide layer (2) (1.3 μm composition, 0.1 μm in the layer thickness, $1×10^{18}$ $cm^{-3}$ in doping concentration), the InGaAs quantum well layer (7 nm in the layer thickness) and InGaAsP barrier (1.3 μm composition, 15 nm in the layer thickness), is selectively grown. The composition and the layer thickness are the value in the gate region 39. The photoluminescence light emitting peak wavelength in the multi-layer quantum well optical waveguide is 1.55 μm in the gate region 39 and 1.4 μm in the optical waveguide.

Next, the $SiO_2$ layer was formed on the surface again. In the gate region 39, in which the electrode 22 is formed, $SiO_2$ mask is formed on the surface of the p-InP clad layer (4) of the waveguide region 31. On the other hand, in the optical waveguide region, a pair of masks of 10 μm in width and 6 μm in the gap, for example are formed at both sides of the waveguide region 31. Subsequently, a p doped high resistance InP layer (1.5 μm in layer thickness, $5×10^{16}$ $cm^{-3}$ of carrier concentration) is grown. Furthermore, in the gate region 39, a pair of stripe form $SiO_2$ masks of 10 μm in width and 6 μm in gap are formed, and in the optical waveguide region, a stripe form $SiO_2$ mask of 26 μm width, for example, covering the waveguide region 31, is formed, again. Then, p-InP layer 5 (1.5 μm in layer thickness, $7×10^{17}$ $cm^{-3}$) and the p-InGaAs contact layer 6 (0.8 μm in layer thickness, $1×10^{19}$ $cm^{-3}$ in doping concentration) are grown.

After completion of epitaxial growth, the $SiO_2$ layer 21 is formed on the surface of the electrode forming region. Then, a window is formed in the surface of the p-InGaAs contact layer 6 to form the stripe shaped p-side electrode 22. After grinding the back surface of the n-InP substrate 1, an n-side electrode 23 is formed on the back surface of the substrate. Then, an anti-reflection coating is provided at both end faces.

To the photonic integrated circuit practically fabricated under the condition set forth above, a laser beam of wavelength 1.55 μm was irradiated. Then, upon injection of current of 50 mA to the gate region, the insertion loss was 4 dB, and greater than or equal to 30 dB was achieved as the extinction ratio of ON/OFF. Since the waveguide structure is buried in the high resistance p-type InP layer, the leak current in the gate region can be suppressed to be low. Also, since doping concentration of the p-type InP layer is low, the waveguide loss in the optical waveguide was suppressed to be in the order of 5 dB/cm. Therefore, low insertion loss characteristics can be realized.

[FIFTH EMBODIMENT]

Figure 13:
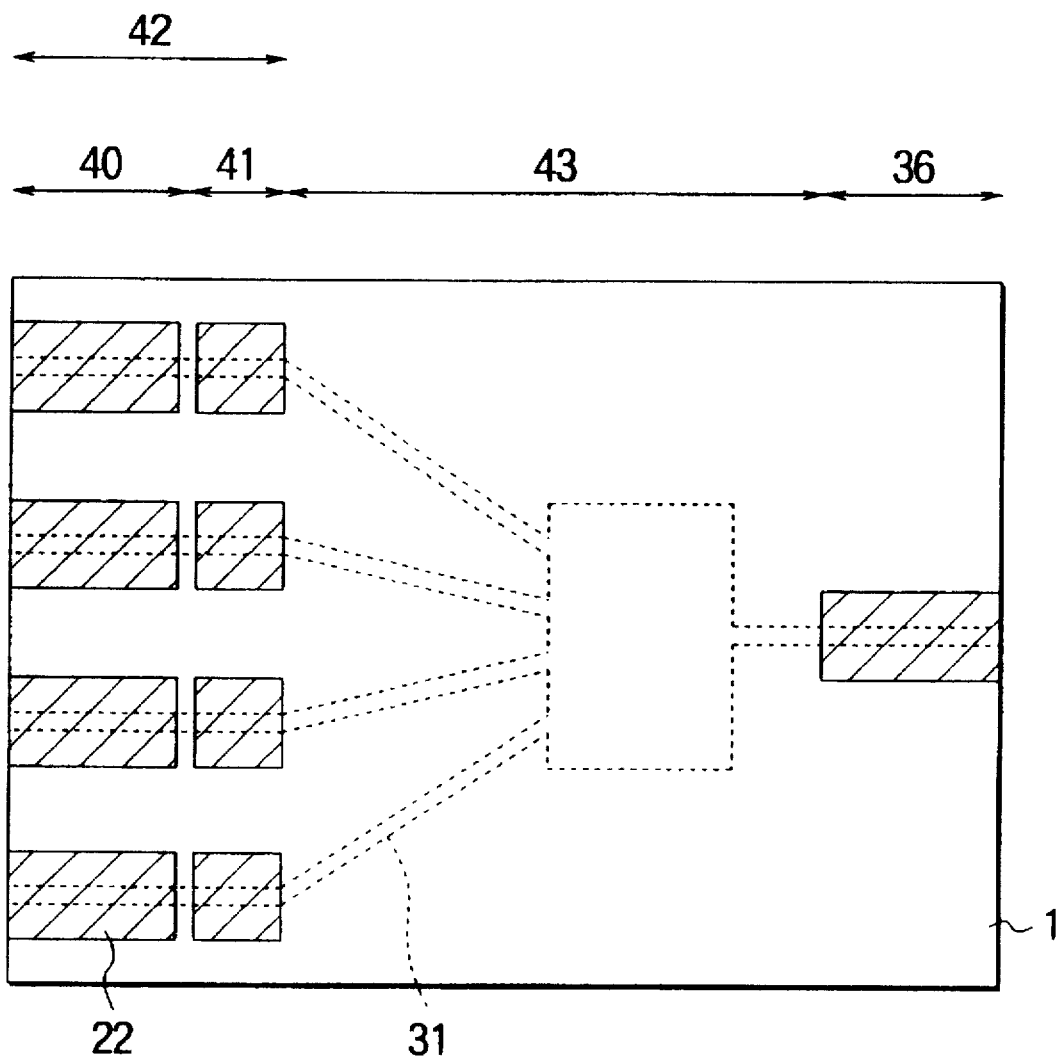
FIG. 13 is a plan view of the fifth embodiment of the present invention.

Next, as the fifth embodiment, an example, in which multi-wavelength DBR (Distributed Bragg Reflector) laser array, an optical coupler and optical amplifier are integrated will be discussed. FIG. 13 is a plan view of the shown embodiment of the integrated circuit. In a DBR laser region 42 having an active region 40 and a DBR region 41, 4 channels of light source is arranged. The light beams are combined in a coupler region 43 and is amplified in the optical amplifier region 36 arranged at the output end. The sectional structure is similar to the foregoing embodiments.

At first, after forming diffraction grating in the DBR region 41 of the n-InP substrate 1, the $SiO_2$ mask is formed. The mask width Wm is 30 μm in the active region 40 and the optical amplifier region 36, for example and 6 μm in the coupler region 43. On the other hand, in the DBR region 41, the mask width Wm is varied from 6 μm to 12 μm at 2 μm per respective channels. With the construction set forth above, oscillation wavelength of the laser can be controlled (Japanese Unexamined Patent Publication No. Heisei 7-15092). The disclosure of the above-identified publication is herein incorporate by reference. The width of the waveguide region 31 defined between the masks is constant at 1.5 μm, for example. Also, a rectangular waveguide region is formed in a beam combining portion of the coupler 43. The lengths of the active region 40 and the DBR region 41 are respective 500 μm and 300 μm, for example. An gap between the channels is 150 μm, and the lengths of the coupler region and the optical amplifier region 36 are respectively 1 mm and 300 μm.

Next, by way of MOVPE method, the waveguide structure of the multi-layer quantum well optical waveguide layer (well number is 7) constituted of the n-InGaAs guide layer (2) (1.3 μm composition, 0.1 μm in the layer thickness, $1×10^{18}$ $cm^{-3}$ in doping concentration), the InGaAs quantum well layer (7 nm in the layer thickness) and InGaAsP barrier (1.3 μm composition, 15 nm in the layer thickness), the InGaAsP confining layer (1.8 μm composition, 0.1 μm in the layer thickness), the p-InP clad layer 4 (0.3 μm in the layer thickness, $7×10^{17}$ $cm^{-3}$ in doping concentration), is selectively grown. The composition and the layer thickness are the value in the active region 40. Then, the photoluminescence light emitting peak wavelength in the multi-layer quantum well optical waveguide is 1.55 μm in the active region 40 and the optical amplifier region 36, for example, 1.4 to 1.47 μm in the DBR region 41, and less than or equal to 1.4 μm in the coupler region.

Next, the $SiO_2$ layer was formed on the surface again. In the gate region 39, in which the electrode 22 is formed, $SiO_2$ mask is formed on the surface of the p-InP clad layer 4 of the waveguide region 31. On the other hand, in the coupler region 43, a pair of masks of 10 μm in width and 6 μm in the gap, for example are formed at both sides of the waveguide region 31. Subsequently, a Fe doped high resistance InP layer (1.5 μm in layer thickness, $5 \times 10^{16}$ cm$^{-3}$ of doping concentration) and n-InP layer (1.5 μm in the layer thickness, $4 \times 10^{18}$ cm$^{-3}$ in doping concentration) are grown. Furthermore, in the current injecting region, a pair of stripe form SiO$_2$ masks of 10 μm in width and 6 μm in gap are formed, and in the coupler region 43, a stripe form SiO$_2$ mask of 26 μm width, for example, covering the waveguide region 31, is formed, again. Then, p-InP layer 5 (1.5 μm in layer thickness, $7 \times 10^{17}$ cm$^{-3}$) and the p-InGaAs contact layer 6 (0.3 μm in layer thickness, $1 \times 10^{19}$ cm$^{-3}$ in doping concentration) are grown.

After completion of epitaxial growth, the SiO$_2$ layer 21 is formed on the surface of the electrode forming region. Then, a window is formed in the surface of the p-InGaAs contact layer 6 to form the stripe shaped p-side electrode 22. After grinding the back surface of the n-InP substrate 1, an n-side electrode 23 is formed on the back surface of the substrate. Then, an anti-reflection coating is provided at both end faces.

The oscillation threshold current of the element fabricated in practice under the condition set forth above was 12 mA, and the optical output upon injection of 100 mA of current was higher than or equal to 1 mW per channel. Also, by varying the mask width in the DBR region per channel, the oscillation wavelength could be varied per 2 nm.

It should be noted that, while the Fe doped semi-insulating semiconductor is employed as high resistance InP layer 11a, it is also possible to dope Cr, Ti, Co or so forth in place of Fe. Also, while discussion has been given for the embodiments employing the undoped semiconductor or high concentration p-type semiconductor, the undoped InP is normally n-type having impurity concentration less than or equal to $1 \times 10^{18}$ cm$^{-3}$ to have higher resistance in comparison with the clad layer which typically has impurity concentration in the order of $1 \times 10^{18}$ cm$^{-3}$. When p-type semiconductor is used, the resistance has to be higher than the p-InP clad layer 4. In addition, in order to suppress intervalence band absorption in the passive region, it becomes necessary to restrict doping concentration to be less than or equal to $5 \times 10^{17}$ cm$^{-3}$, which is lower than that normally employed the p-InP clad layer.

On the other hand, in the foregoing embodiments, the p-InP layer or the contact layer are formed after formation of the high resistance InP layer. However, it is possible to modify the order to grow the high resistance InP layer at later step.

Also, concerning the elements to be packaged in the photonic integrated circuit according to the present invention, has been disclosed. However, the present invention is application. Furthermore, the structure of the waveguide structure or semiconductor material, generally known various kinds may be employed.

What is claimed is:

1. A semiconductor photonic integrated circuit comprising:
   a first conductive type semiconductor substrate having first region and a second region on the surface thereof;
   a first optical waveguide layer formed in mesa form on said first region of said first conductivity type semiconductor substrate;
   a second optical waveguide layer formed continuously with said first optical waveguide layer, of a material having larger bandgap energy than said first optical waveguide layer within said second region on said first conductivity type semiconductor substrate;
   a high resistance semiconductor layer covering a side surface of said first optical waveguide layer and an upper surface of said second optical waveguide layer; and
   a second conductivity type semiconductor layer covering an upper surface of said first optical waveguide.

2. A semiconductor photonic integrated circuit as set forth in claim 1, wherein said second optical waveguide is formed into a mesa form having width substantially equal to that of said first optical waveguide or a width gradually reducing from a substantially equal width to that of said first optical waveguide, and a side surface of said second optical waveguide layer is covered with said high resistance semiconductor layer.

3. A semiconductor photonic integrated circuit as set forth in claim 1, wherein said high resistance semiconductor layer is formed of one of materials selected among a group of an undoped semiconductor, a semiconductor having accepter concentration of less than or equal to $5 \times 10^{17}$ cm$^{-3}$ and a semiconductor doped with Fe, Cr, Ti or Co.

4. A semiconductor photonic integrated circuit as set forth in claim 1, wherein said first and second optical waveguide layer has a quantum well structure.

5. A semiconductor photonic integrated circuit as set forth in claim 2, wherein said high resistance semiconductor layer is formed of one of materials selected among a group of an undoped semiconductor, a semiconductor having accepter concentration of less than or equal to $5 \times 10^{17}$ cm$^{-3}$ and a semiconductor doped with Fe, Cr, Ti or Co.

6. A semiconductor photonic integrated circuit as set forth in claim 2, wherein said first and second optical waveguide layer has a quantum well structure.

* * * * *